(12) United States Patent
Goth

(10) Patent No.: US 7,577,193 B2
(45) Date of Patent: Aug. 18, 2009

(54) ADAPTIVE EQUALIZER

(75) Inventor: Bjarke Goth, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 588 days.

(21) Appl. No.: 11/169,327

(22) Filed: Jun. 28, 2005

(65) Prior Publication Data

US 2006/0291551 A1 Dec. 28, 2006

(51) Int. Cl.
*H03H 7/30* (2006.01)
(52) U.S. Cl. .................. 375/232; 375/233; 375/229; 333/18
(58) Field of Classification Search .......... 375/233, 375/232, 229; 333/18
See application file for complete search history.

(56) References Cited

U.S. PATENT DOCUMENTS

| 5,132,926 | A | * | 7/1992 | MacEachern et al. | 708/819 |
|---|---|---|---|---|---|
| 5,301,196 | A | * | 4/1994 | Ewen et al. | 370/518 |
| 5,321,723 | A | * | 6/1994 | Mizoguchi | 375/233 |
| 5,841,602 | A | * | 11/1998 | Kanegae et al. | 360/51 |
| 5,905,769 | A | * | 5/1999 | Lee et al. | 375/376 |
| 6,055,269 | A | * | 4/2000 | Drost et al. | 375/232 |
| 2002/0122443 | A1 | * | 9/2002 | Enam et al. | 370/537 |
| 2005/0074070 | A1 | * | 4/2005 | Betts | 375/265 |
| 2005/0135470 | A1 | * | 6/2005 | Momtaz | 375/233 |

* cited by examiner

*Primary Examiner*—Shuwang Liu
*Assistant Examiner*—Michael R Neff
(74) *Attorney, Agent, or Firm*—Schwegman, Lundberg & Woessner, P.A.

(57) ABSTRACT

Some embodiments of the invention include apparatus, systems, and methods to adjust a clock generator and an equalizer to reduce jitter in an output signal. A phase detector provides feedback information on a first feedback loop and a second feedback loop. A clock adjustment circuit uses the feedback information on the first feedback loop to adjust a clock generator. An equalizer adjustment circuit uses the feedback information on the second feedback loop to adjust the equalizer. Other embodiments are described and claimed.

21 Claims, 8 Drawing Sheets

| | D" | D' | D | TB | ADJUST CLK | ADJUST EQUALIZER |
|---|---|---|---|---|---|---|
| 421 | 0 | 0 | 0 | | | |
| 411 | 0 | 0 | 1 | 0 | ↑ | ↑ |
| 412 | 0 | 0 | 1 | 1 | ↓ | ↓ |
| 413 | 0 | 1 | 0 | 0 | ↓ | |
| 414 | 0 | 1 | 0 | 1 | ↑ | |
| 422 | 0 | 1 | 1 | | | |
| 423 | 1 | 0 | 0 | | | |
| 415 | 1 | 0 | 1 | 0 | ↑ | |
| 416 | 1 | 0 | 1 | 1 | ↓ | |
| 417 | 1 | 1 | 0 | 0 | ↓ | ↓ |
| 418 | 1 | 1 | 0 | 1 | ↑ | ↑ |
| 424 | 1 | 1 | 1 | | | |

| | D" | D' | D | TB | ADJUST CLK | | ADJUST EQUALIZER | |
|---|---|---|---|---|---|---|---|---|
| | | | | | DN1 | UP1 | DN2 | UP2 |
| 721 | 0 | 0 | 0 | | | | | |
| 711 | 0 | 0 | 1 | 0 | 0 | 1 | 0 | 1 |
| 712 | 0 | 0 | 1 | 1 | 1 | 0 | 1 | 0 |
| 713 | 0 | 1 | 0 | 0 | 1 | 0 | | |
| 714 | 0 | 1 | 0 | 1 | 0 | 1 | | |
| 722 | 0 | 1 | 1 | | | | | |
| 723 | 1 | 0 | 0 | | | | | |
| 715 | 1 | 0 | 1 | 0 | 0 | 1 | | |
| 716 | 1 | 0 | 1 | 1 | 1 | 0 | | |
| 717 | 1 | 1 | 0 | 0 | 1 | 0 | 1 | 0 |
| 718 | 1 | 1 | 0 | 1 | 0 | 1 | 0 | 1 |
| 724 | 1 | 1 | 1 | | | | | |

*Fig. 7*

ADAPTIVE EQUALIZER

FIELD

Embodiments of the present invention relate generally to circuits that correct distortion of signals on non-ideal communication channels, and particularly to equalizer circuits.

BACKGROUND

Integrated circuits typically communicate with each other using conductive transmission lines such as traces on a printed wiring board or cables. An "ideal" transmission line conducts electrical signals from one integrated circuit to another integrated circuit without distortion. In practice, perfectly ideal transmission lines do not exist. As a result, signals that are driven onto one end of a transmission line emerge with varying amounts of distortion at the other end of the transmission line.

The signal usually carries multiple bits of information or data bits. As the distortion increases and the speed of the communication increases, the distortion from a bit of data may cause an adjacent bit of data to be received incorrectly. In some high speed communication where data is transferred at multiple gigabits per second, the distortion may cause pattern jitter to be present in the signal. Pattern jitter is an accumulation of the distortion (jitter) of the data bits at the receiving end of the transmission line.

Various techniques are designed to reduce the distortion caused by imperfect transmission lines. However, as the rate of the transfer of the data gets higher designing a simple technique to deal with the distortion and to suit different lengths of different transmission lines may become difficult.

BRIEF DESCRIPTION OF DRAWINGS

FIG. 4 is a chart showing feedback information generated by a phase detector of FIG. 1

FIG. 7 is a chart showing feedback information generated by a phase detector of FIG. 5.

DESCRIPTION OF EMBODIMENTS

Figure 1:
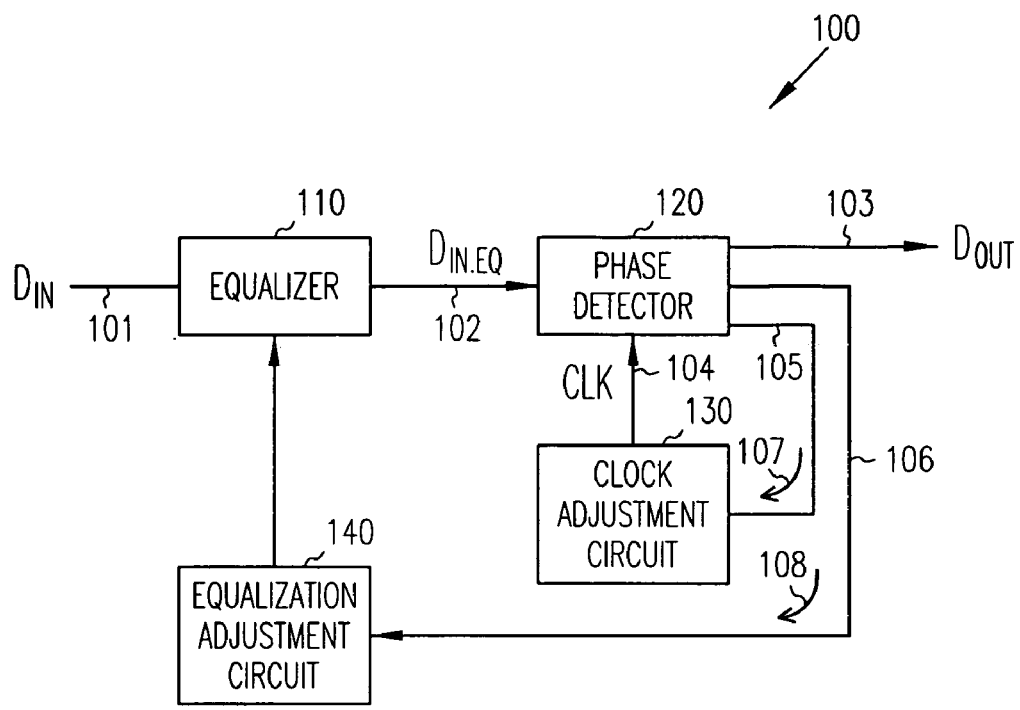
FIG. 1 shows an apparatus according to an embodiment of the invention.

FIG. 1 shows an apparatus according to an embodiment of the invention. Apparatus 100 receives an input data signal $D_{IN}$ from transmission line 101 and provides an output data signal $D_{OUT}$ at an output 103. $D_{OUT}$ is a retimed version of $D_{IN}$.

Apparatus 100 includes an equalizer 110 to compensate the $D_{IN}$ signal for any signal distortion in amplitude and phase including any pattern jitter during transmission of the $D_{IN}$ signal on transmission line 101. Equalizer 110 provides the compensated or "equalized" version of the $D_{IN}$ signal to a phase detector 120 as $D_{IN.EQ}$. Equalizer 110 may be a peaking equalizer with an amplification scheme to amplify an incoming signal, such as the $D_{IN}$ signal, at a rate equaled to half of the data rate represented by the incoming signal. For example, when the $D_{IN}$ signal has a frequency of 10 gigahertz ($10^6$ Hz) that may carry data at a data rate of 10 gigabits ($10^6$ bits) per second, equalizer 110 may amplify the five gigahertz portion of the $D_{IN}$ signal.

Phase detector 120 receives the $D_{IN.EQ}$ signal at an input 102 and provides the $D_{OUT}$ signal based on a clock signal CLK at a clock input 104. The $D_{OUT}$ signal is a retimed version of the $D_{IN.EQ}$ signal. Phase detector 120 provides feedback information to a combination of feedback outputs 105 and 106. In apparatus 100, the feedback information is generated based on bit values of consecutive data bits of the $D_{IN.EQ}$ signal. Two consecutive data bits are used by phase detector 120 to generate the feedback information on feedback output 105. Three consecutive data bits are used by phase detector 120 to generate the feedback information on feedback output 106. Phase detector 120 may be a binary phase detector. In some embodiments, phase detector 120 includes a bang-bang phase detector such as an Alexander bang-bang phase detector.

A clock feedback loop 107 couples between feedback output 105 and clock input 104. A clock adjustment circuit 130 uses the feedback information on feedback loop 107 to adjust the CLK signal. Clock adjustment circuit 130 may include any combination of a charge pump, a loop filter, and a clock generator to generate the CLK signal. In some embodiments, the CLK signal represents a combination of two separate clock signals having 180 degrees phase shift. The loop filter may be an analog or digital loop filter. The clock generator may include a voltage-controlled oscillator (VCO). The VCO may be a differential VCO. In these embodiments, the feedback information from feedback output 105 of phase detector 120 of FIG. 1 may be used to increase or decrease the amount of charge in the charge pump to increase or decrease the frequency of the VCO to adjust the phase of the CLK signal.

An equalization feedback loop 108 couples between feedback output 106 and equalizer 110. An equalization adjustment circuit 140 uses the feedback information on feedback loop 108 to adjust equalizer 110. Equalization adjustment circuit 140 may include an analog or digital equalizer loop filter.

Equalization adjustment circuit 140 allows equalizer 110 to be adaptive to compensate the $D_{IN}$ signal for any distortion such as the pattern jitter that may be caused by variation in transmission line 101 and by variation in the length of the transmission line 101. Since the $D_{OUT}$ signal is a retimed version of the $D_{IN}$ signal, the $D_{OUT}$ signal is also compensated when the $D_{IN}$ signal is compensated by equalizer 110.

Figure 2:
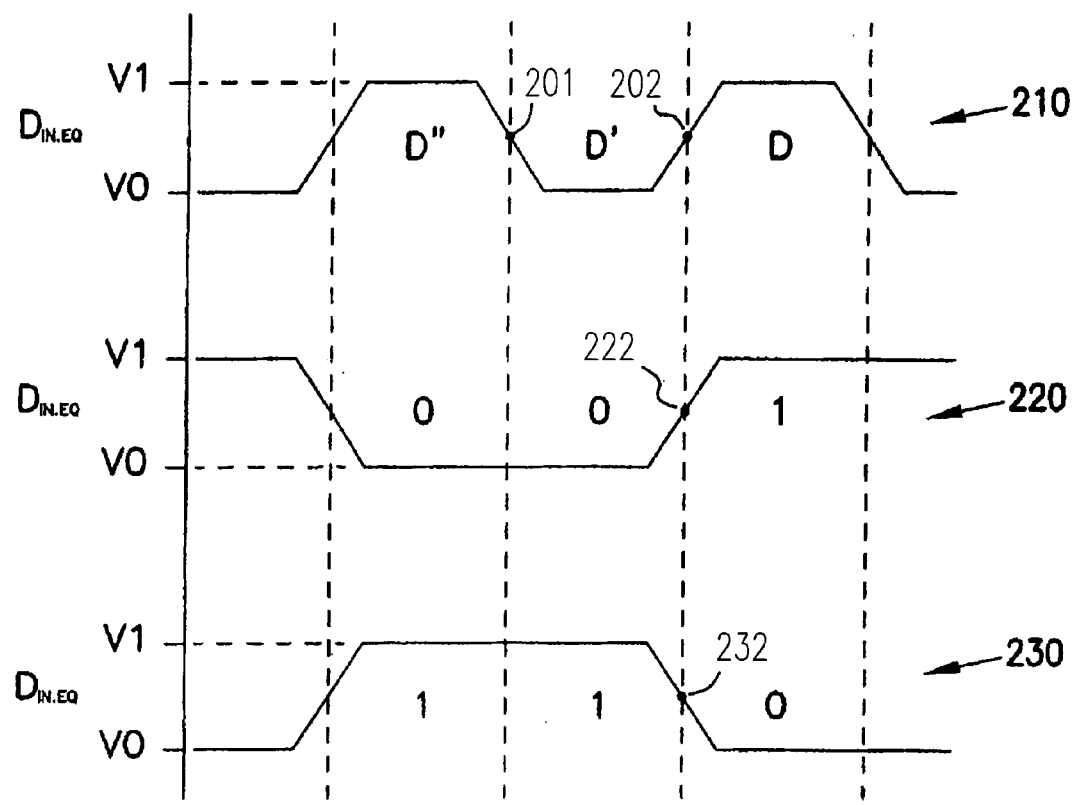
FIG. 2 is an exemplary timing diagram for an input data signal of FIG. 1.

FIG. 2 is an exemplary timing diagram for an input data signal of FIG. 1. FIG. 2 shows the $D_{IN.EQ}$ signal in three different exemplary situations 210, 220, and 230. The exemplary timing diagram of FIG. 2 may also be applied to the $D_{OUT}$ signal of FIG. 1 because the $D_{OUT}$ signal is a retimed version of the $D_{IN.EQ}$ signal.

In each of the situations 210, 220, and 230 of FIG. 2, the $D_{IN.EQ}$ signal has three consecutive data bits: a first data bit D", a second data bit D', and a third data bit D. Phase detector 120 of FIG. 1 receives D" before D', and D' before D. Thus, D is also referred to as the current data bit, D' is the old data bit (previous data bit), and D" is the oldest data bit (data bit before the previous data bit). In FIG. 2, signal level V0 corresponds to a low signal level (logic zero or binary zero). Signal level V1 corresponds to high signal level (logic one or binary one). A bit value of each of the data bits D", D', and D corresponds to the signal level of the $D_{IN.EQ}$ signal. Thus, in situation 210 of FIG. 2, D" has a bit value of one, D' has a bit value of zero, and D has a bit value of one. In binary number terms, D", D', and D in situation 210 are 010. FIG. 2 also shows the $D_{IN\_EQ}$ signal having a transition (switch) from high to low between D" and D, and from low to high between D' and D. Each of the points 201, 202, 222, and 232 represents a midpoint of a transition when $D_{IN\_EQ}$ makes a transition between high and low.

The feedback information on feedback loop 107 is generated when the bit values of D' and D are different such as when the bit values of D' and D are binary 01 or 10 as shown in each of the situations 210, 220, and 230 in FIG. 2. No useful feedback information is generated when bit values of D' and D are equal.

The feedback information on feedback loop 108 is generated when the bit values of D" and D' are the same and the bit values of D' and D are different such as when the bit values of D", D', and D are 001 or 110 as shown in situations 220 and 230 of FIG. 2. No useful feedback information is generated from other combinations of D", D', and D such as the combination shown in situation 210 of FIG. 2.

When a jitter such as pattern jitter is present among D", D' and D, the feedback information from phase detector 120 enables clock adjustment circuit 130 to adjust the CLK signal in a selected direction to reduce the jitter. For example, clock adjustment circuit 130 may either speed up or slow down the CLK signal. In some embodiments, the frequency of CLK signal is increased or decreased when the CLK is adjusted. The feedback information from phase detector 120 also enables equalization adjustment circuit 140 to adjust equalizer 110 in a selected direction to reduce the jitter. For example, equalization adjustment circuit 140 may either turn up or turn down equalizer 110 to reduce any jitter present in the $D_{IN\_EQ}$ signal. In some embodiments, the gain of equalizer 110 is increased or decreased when equalizer 110 is adjusted.

The direction of the adjustment to the CLK signal and to equalizer 110 of FIG. 1 depends on a bit value of a transition bit. In FIG. 2, the transition bit may be obtained when jitter or a pattern jitter is present among D", D' and D. Phase detector 120 is configured to sample the midpoint of a transition between the old data bit (D') and the current data bit (D) to obtain the transition bit. If there is no transition between D' and D, the transition bit does not exist. If there is a transition between D' and D, such as a transition at point 202, 222, or 232 of FIG. 2, and when jitter is present among D", D' and D, a transition bit may be obtained. Phase detector 120 determines the bit value of the transition bit to indicate the appropriate direction for the adjustment to reduce the jitter. The transition bit and the bit value of the transition bit are discussed in FIG. 3 and FIG. 4.

Figure 3:
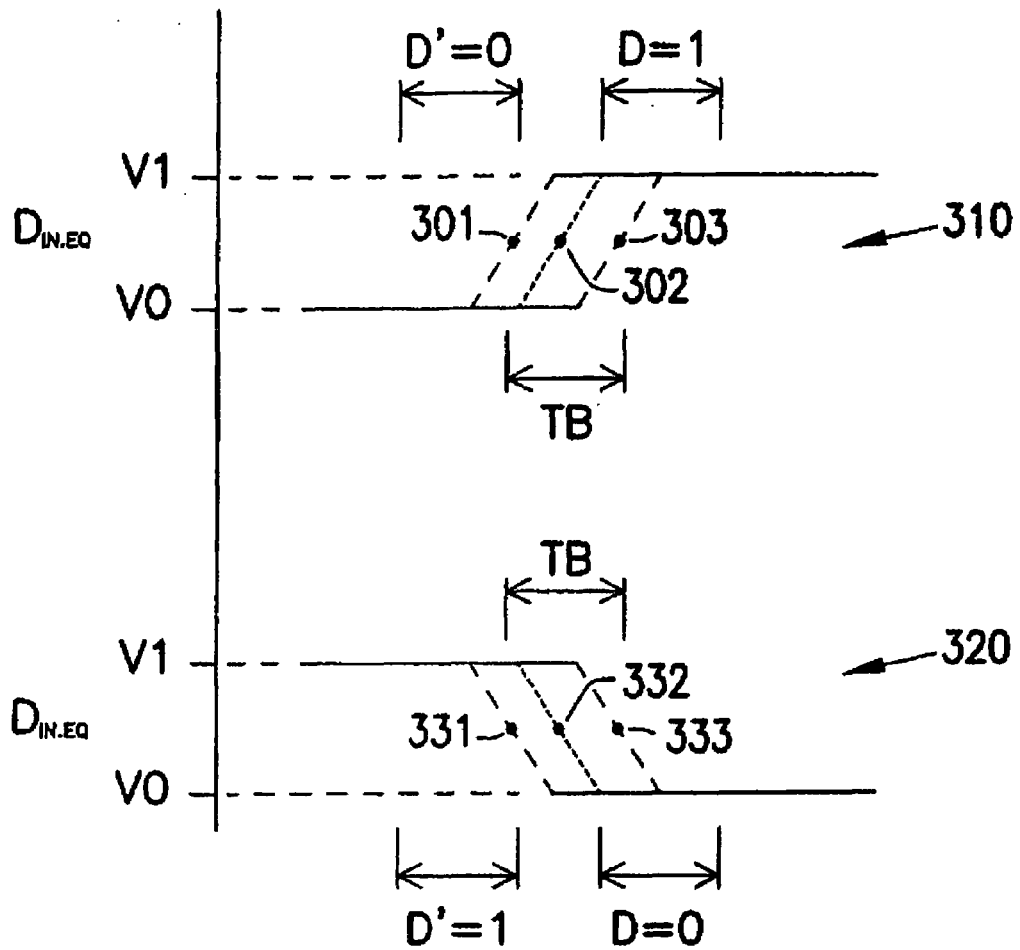
FIG. 3 is an exemplary timing diagram showing a transition of an input data signal of FIG. 1.

FIG. 3 is an exemplary timing diagram showing a transition of an input data signal of FIG. 1. FIG. 3 shows the $D_{IN\_EQ}$ signal in two different exemplary situations 310 and 320. In situation 310, the $D_{IN\_EQ}$ signal has a transition from low to high. In situation 320, the $D_{IN\_EQ}$ signal has a transition from high to low. The exemplary timing diagram of FIG. 3 may also be applied to the $D_{OUT}$ signal of FIG. 1 because the $D_{OUT}$ signal is a retimed version of the $D_{IN\_EQ}$ signal.

In FIG. 3, D' represents the previous or old data bit, D represents the current data bit, and TB represents the transition bit. As shown in situation 310 of FIG. 3, the $D_{IN\_EQ}$ signal has a transition from low (V0) to high (V1). Point 302 may represent an expected midpoint of the transition when no pattern jitter is present in the $D_{IN\_EQ}$ signal. In some cases, a presence of the pattern jitter in the $D_{IN\_EQ}$ signal may cause the midpoint of the transition to shift from point 302 to another point, for example to point 301 or to point 303. Depending on when the midpoint of the transition occurs, TB may have a bit value of either one or zero. For example, TB may have a bit value of zero (value of D') when the midpoint of the transition is point 301. TB may have a bit value of one (value of D) when the midpoint of the transition is point 302.

In situation 320, the $D_{IN\_EQ}$ signal has a transition from high (V1) to low (V0). Point 332 may represent an expected midpoint of the transition when no pattern jitter is present in the $D_{IN\_EQ}$ signal. Points 331 and 333 may represent midpoints with a presence of a pattern jitter. TB may have a bit value of one (value of D') when the midpoint of the transition is point 301. TB may have a bit value of zero (value of D) when the midpoint of the transition is point 302.

Based on the bit value of TB, phase detector 120 of FIG. 1 indicates an appropriate adjustment direction in the feedback information provided at feedback outputs 105 and 106. Based on the feedback information, clock adjustment circuit 130 appropriately adjusts the CLK signal; equalization adjustment circuit 140 appropriately adjusts equalizer 110. The combination of the adjustment by clock adjustment circuit 130 and the adjustment by equalization adjustment circuit 140 may reduce any pattern jitter present in the $D_{IN\_EQ}$ signal such that point 301 or point 303 in situation 310 of FIG. 3 may be pulled closer to the expected midpoint 302. Similarly, the combination of the adjustment by clock adjustment circuit 130 and the adjustment by equalization adjustment circuit 140 may reduce any pattern jitter present in the $D_{IN\_EQ}$ signal such that point 331 or point 333 in situation 320 of FIG. 3 may be pulled closer to the expected midpoint 332. As a result, the signal relationship between the $D_{OUT}$ and CLK signals may be improved and any pattern jitter in the $D_{OUT}$ signal may be reduced.

FIG. 4 is a chart showing the feedback information generated by phase detector 120 of FIG. 1. In FIG. 4, feedback information 401 is generated based on the bit values of D", D', and D, and the bit value of the transition bit TB. The directions of arrows in FIG. 4 represent first and second directions such as speeding up and slowing down the CLK signal in FIG. 1 and turning up and turning down equalizer 110 of FIG. 1.

The presence of the arrows in a particular combination of D", D', D, and TB indicates that useful feedback information may be generated. The absence of the arrows in a particular combination of D", D', D, and TB indicates that no useful feedback information may be generated. For example, useful feedback information may be generated to adjust the CLK signal when D", D', D, and TB have combinations 411 through 418, whereas useful feedback information may be generated to adjust equalizer 110 only when D", D', D, and TB have combinations 411, 412, 417, and 418. Combinations 421, 422, 423, and 424 provide no useful information because the bit values of D' and D are the same (00 or 11) or no transition exits between D' and D. Thus, no feedback information may be generated in combinations 421, 422, 423, and 424, resulting in neither the CLK signal nor equalizer 110 being adjusted. Combinations 413, 414, 415, and 416 provides no useful feedback information to adjust equalizer 110 because a transition between D" and D' may be either zero or one in the present of the pattern jitter. Thus, although D' and D has a transition in each of the combinations 413, 414, 415, and 416, the bit value of the transition in these combinations may not be useful because the bit value of the transition between D" and D' may be either zero or one.

In some embodiments, the first direction represented by the direction of the arrows in feedback information 401 of FIG. 4 enables clock adjustment circuit 130 to speed up the CLK signal in FIG. 1 and enables equalization adjustment circuit 140 to turn up equalizer 110. In some embodiments, the second direction represented by the direction of the arrows from feedback information 401 of FIG. 4 enables clock adjustment circuit 130 to slow down the CLK signal in FIG. 1 and enables equalization adjustment circuit 140 to turn down equalizer 110. As discussed above in FIG. 1 through FIG. 3, the combination of the adjustment by clock adjustment circuit 130 and the adjustment by equalization adjustment circuit 140 may improve the signal relationship between the $D_{OUT}$ and CLK signals and may also reduce any pattern jitter in the $D_{OUT}$ signal.

Figure 5:
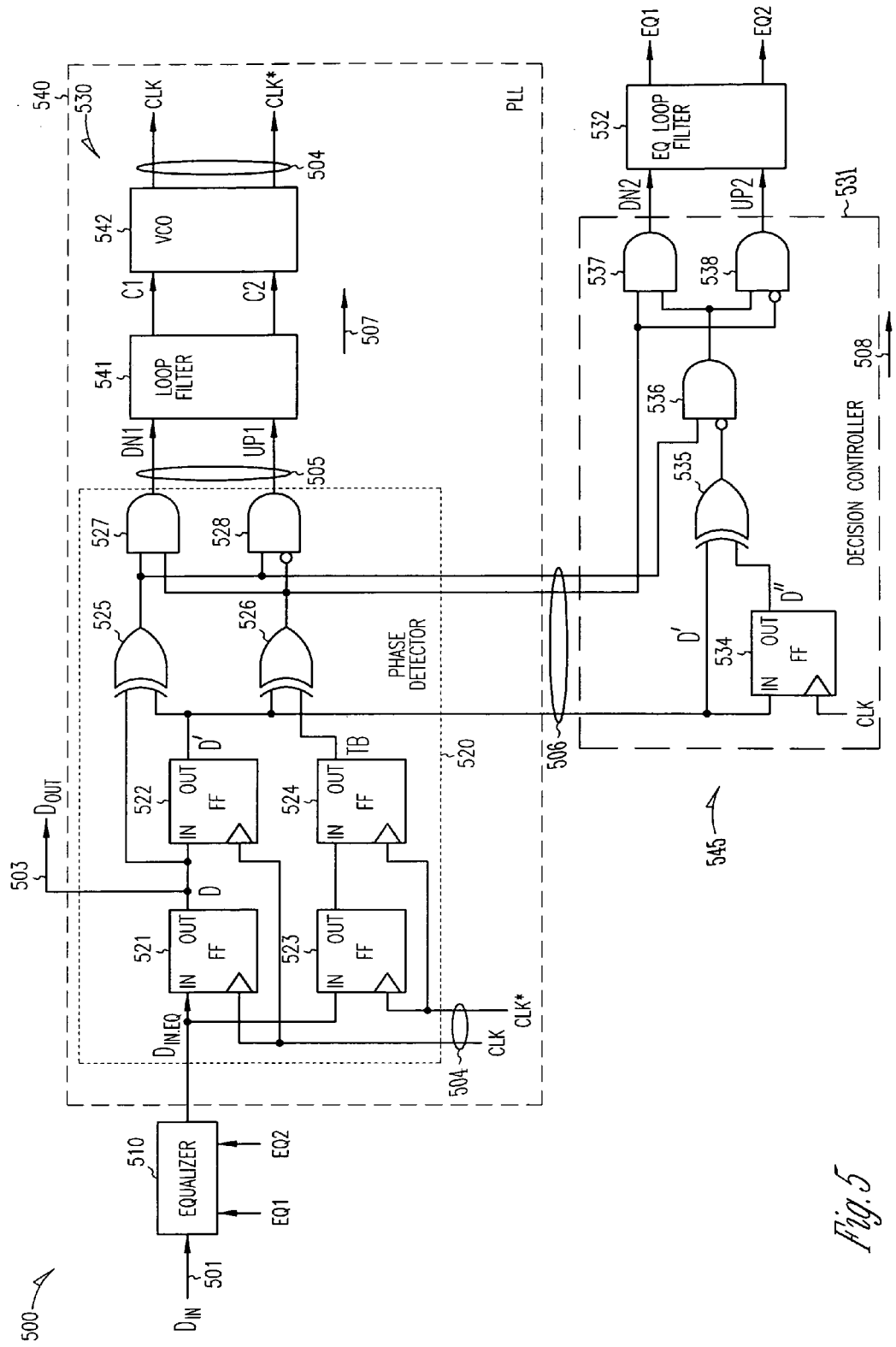
FIG. 5 shows an apparatus according to another embodiment of the invention.

FIG. 5 shows an apparatus according to another embodiment of the invention. Apparatus 500 receives an input data signal $D_{IN}$ at a transmission line 501 and provides an output data signal $D_{OUT}$ at an output 503. $D_{OUT}$ is a retimed version of $D_{IN}$.

Apparatus 500 includes a phase-locked loop (PLL) 540 formed by a phase detector 520, loop filter 541, and VCO 542. PLL 540 may be used as a clock-data-recovery (CDR) circuit to recover the $D_{IN}$ or $D_{IN.EQ}$ signal and the clock signals CLK and CLK* based on the frequency component of $D_{IN.EQ}$ signal. Phase detector 520 places the CLK and CLK* signals signal relative to the average transition time (midpoint between two data bits) of the $D_{IN.EQ}$ signal. Since pattern jitter may be present in the $D_{IN.EQ}$ signal, the $D_{IN.EQ}$ and CLK signals may have a phase difference. Loop filter 541 and VCO 542 enable PLL 540 to correct any phase difference between the $D_{IN.EQ}$ and CLK signals to improve the timing of the $D_{OUT}$ signal.

Apparatus 500 also includes an equalizer 510, a decision controller 531, and an equalizer loop filter 532. Decision controller 531 and an equalizer loop filter 532 allows equalizer to be adaptive by using the feedback information from PLL 540 to further reduce any pattern jitter may be present in the $D_{IN}$ signal during transmission of the $D_{IN}$ signal on transmission line 501.

A clock feedback loop 507 couples between feedback output 505 and clock input 504. A clock adjustment circuit 530 (including loop filter 541 and VCO 542) on feedback loop 507 uses the feedback information from feedback output 505 to adjust the CLK and CLK* signals. In some embodiments, the CLK and CLK* signals are differential clock signals. Feedback output 505 provides adjust signals DN1 and UP1. Based on the DN1 and UP1 signal, loop filter 541 generates control signals C1 and C2. VCO 542 adjusts the timing of the CLK and CLK* signals based on the C1 and C2 signals.

An equalization feedback loop 508 couples between feedback output 506 and equalizer 510. An equalization adjustment circuit 545 (including decision controller 531 and equalizer loop filter 532) uses the feedback information from feedback output 506 to adjust equalizer 510. Based on the feedback information on feedback output 506, decision controller 531 generates adjust signals DN2 and UP2. Equalizer loop filter 532 generates equalizer adjust signals EQ1 and EQ2 based on the DN2 and UP2 signals to adjust equalizer 510. Equalizer loop filer 532 may be an analog or digital loop filter.

Phase detector 520 includes a number of flip flops (FF) 521, 522, 523, and 524, each having an input IN and an output OUT. Flip flops 521 and 522 respond to the CLK signal to provide a data bit from IN to OUT. Flip flops 523 and 524 respond to the CLK* signal to transfer a data bit from IN to OUT. Phase detector 520 uses flip flop 521 to provide data bit D and flip flop 522 to provide data bit D'. D represents the current data bit. D' represents the old or previous data bit.

Phase detector 520 determines the value of the transition bit TB at flip flop 524 by feeding the $D_{IN.EQ}$ signal through flip flops 523 and 524 and sampling $D_{IN.EQ}$ at flip flops 523 and 524 using the CLK* signal. The CLK* signal is a half clock cycle offset from the CLK signal (180 degrees out of phase with the CLK signal). Thus, since the CLK* is a half clock cycle offset from CLK signal, the CLK* signal enables phase detector 520 to sample the $D_{IN.EQ}$ signal at a midpoint of a transition between two data bit such as between D' and D.

When a jitter such as pattern jitter is present, the value of the TB signal indicates whether the midpoint resulted from the sampling is lagging or leading the expected midpoint. Phase detector 520 uses the bit value of TB to indicate the direction for the adjustment of the CLK and CLK* signals and equalizer 510. For example, when the value of TB indicates that the sampled midpoint is lagging the expected midpoint, the CLK signal may be sped up and equalizer 510 may be turned up. As another example, when the value of TB indicates that the sampled midpoint is leading the expected midpoint, the CLK signal may be slowed down and equalizer 510 may be turned down.

Phase detector 520 includes exclusive OR (XOR) gates 525 and 526 to compare the bit values of D', D, and TB to determine whether the bit values of D' and D are different. The result of the comparison is provided to AND gates 527 and 528. Depending on the result from the comparison from XOR gates 525 and 526, AND gates 527 and 528 cause DN1 and UP1 to have different combinations of values. The different combinations of values of DN1 and UP1 correspond to different adjustment directions for the CLK and CLK* signals. For example, when the bit values of D', D, and TB are 010, DN1 has a value of zero and UP1 has a value of one (DN1=0, UP1=1); in this example, loop filter 541 may cause VCO 542 to speed up the CLK and CLK* signals to adjust the phase difference between the $D_{OUT}$ signal and CLK signals. As another example, when the bit values of D', D, and TB are 011, DN1 has a value of one and UP1 has a value of zero (DN1=1, UP1=0); in this example, loop filter 541 may cause VCO 542 to slow down the CLK and CLK* signals to adjust the phase difference between the $D_{OUT}$ and CLK signals.

Decision controller 531 includes a flip flop 534 to retain a copy of D' at input IN to provide D" at output OUT based on the CLK signal. Decision controller 531 includes an XOR gate 535 to compare the bit values of D" and D'. The result of the comparison is provided to AND gate 536. AND gate 536 compares the result from XOR gate 534 and XOR gate 525 of phase detector 520 to determine whether the bit values of D" and D' are equal and whether the bit values of D' and D are different. The result of the comparison by AND gate 536 is provided to AND gates 537 and 538. Depending on the result from the comparison from AND gate 536 and XOR gate 526 of phase detector 520, AND gates 537 and 538 cause DN2 and UP2 to have different combinations of values. The different combinations of values of DN1 and UP1 correspond to different adjustment directions for equalizer 510.

For example, when the bit values of D", D', D, and TB are 0010, DN2 has a value of zero and UP2 has a value of one (DN2=0, UP2=1); in this example, equalizer loop filter 532 causes the EQ1 and EQ2 signals to turn up equalizer 510 to reduce any pattern jitter present in the $D_{OUT}$ signal. As another example, when the bit values of D", D', D, and TB are 0011, DN2 has a value of one and UP2 has a value of zero (DN2=1, UP2=0); in this example, equalizer loop filter 532 causes the EQ1 and EQ2 signals to turn down equalizer 510 to reduce any pattern jitter present in the $D_{OUT}$ signal.

As described above, since both feedback loop 507 and 508 use the same information from phase detector 520 to correct any phase difference between the $D_{OUT}$ and CLK signals and any pattern jitter present in the $D_{OUT}$ signal, a simple design for a clock-data-recovery circuit with an adaptive equalization control such as apparatus 500 may be achieved.

Figure 6:
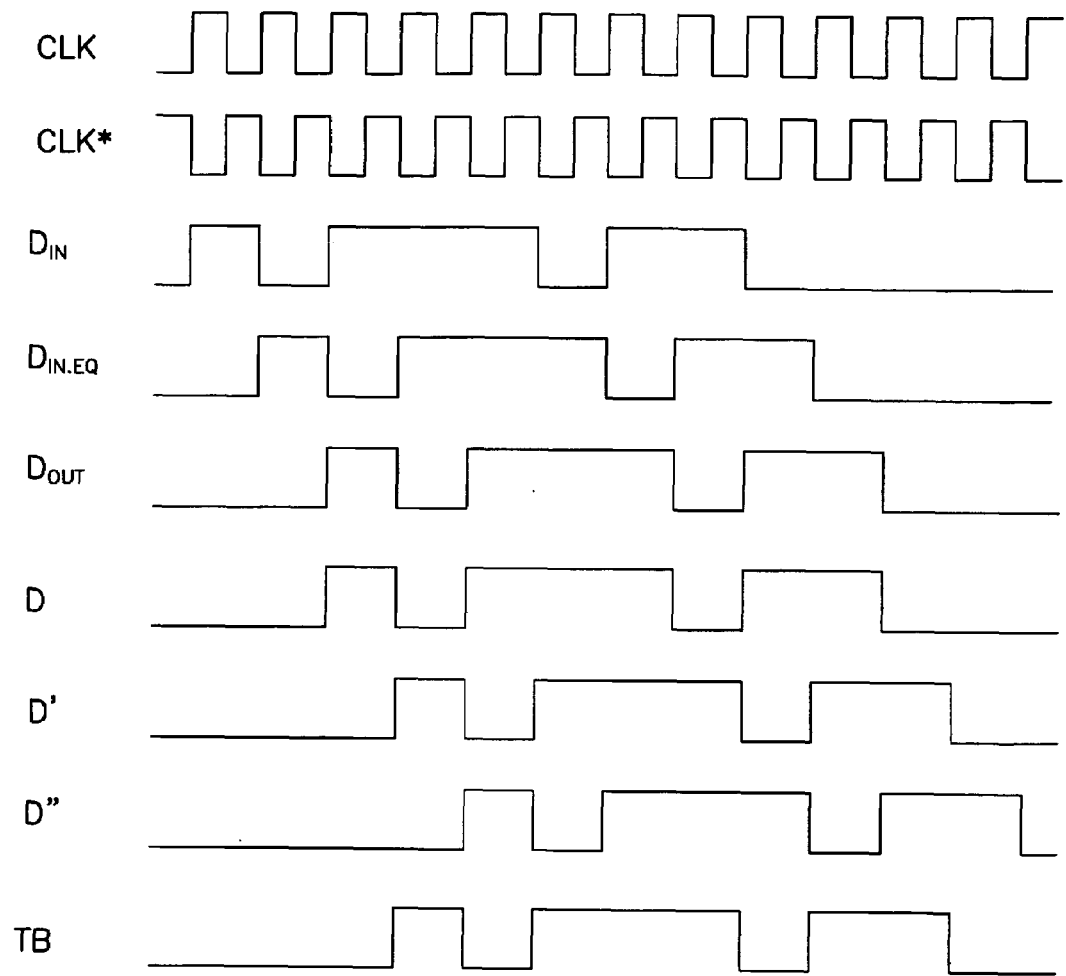
FIG. 6 is an exemplary timing for FIG. 5.

FIG. 6 is an exemplary timing for apparatus 500 of FIG. 5. For purposes of illustration, FIG. 6 shows the signals as square waves and omits any phase differences or pattern jitter among the signals. Further, FIG. 6 assumes that the $D_{IN}$ signal and the $D_{IN\_EQ}$ signal is separated by one cycle of the CLK signal. As shown in FIG. 6, the $D_{OUT}$ signal is a retimed version of the $D_{IN}$ signal or the $D_{IN\_EQ}$ signal; the D", D', and D have the same bit value after each cycle of the CLK signal. FIG. 6 shows only example for possible signal levels of TB; the signal level of TB is determined by the sampling point of the transition between D' and D. Thus, the signal levels of TB may be different from the signal levels shown in FIG. 6.

FIG. 7 is a chart showing the feedback information generated by phase detector 120 of FIG. 5. In FIG. 7, feedback information 701 is generated based on the bit values of D", D', and D, and the bit value of the transition bit TB. Bit values zeros and ones in FIG. 7 represent first and second directions.

The presence of zeros and ones in a particular combination of D", D', D, and TB indicates that useful feedback information may be generated. The absence of zeros and ones in a particular combination of D", D', D, and TB indicates that no useful feedback information may be generated. For example, useful feedback information may be generated to adjust the CLK signal when D", D', D, and TB have combinations 711 through 718, whereas useful feedback information may generated to adjust equalizer 110 only when D", D', D, and TB have combinations 711, 712, 717, and 718. Combinations 721, 722, 723, and 724 provide no useful information because the bit values of D' and D are the same (00 or 11) or no transition exits between D' and D. Thus, no feedback information may be generated in combinations 721, 722, 723, and 724 resulting in neither the CLK signal nor equalizer 110 being adjusted. Combinations 713, 714, 715, and 716 provides no useful feedback information to adjust equalizer 110 because a transition between D" and D' may be either zero or one in the presence of the pattern jitter. Thus, although D' and D has a transition in each of the combinations 713, 714, 715, and 716, the bit value of the transition in these combinations may not be useful because the bit value of the transition between D" and D' may be either zero or one.

In some embodiments, the first direction represented by zeros and ones in feedback information 701 of FIG. 7 enables clock adjustment circuit 130 to speed up the CLK signal in FIG. 5 and enables equalization adjustment circuit 140 to turn up equalizer 110. In some embodiments, the second direction represented by zeros and ones in feedback information 701 of FIG. 7 enables clock adjustment circuit 130 to slow down the CLK signal in FIG. 5 and enables equalization adjustment circuit 140 to turn down equalizer 110. As discussed above in FIG. 5, the combination of the adjustment by clock adjustment circuit 130 and the adjustment by equalization adjustment circuit 140 may improve the signal relationship between the $D_{OUT}$ and CLK signals and may reduce any pattern jitter in the $D_{OUT}$ signal.

Figure 8:
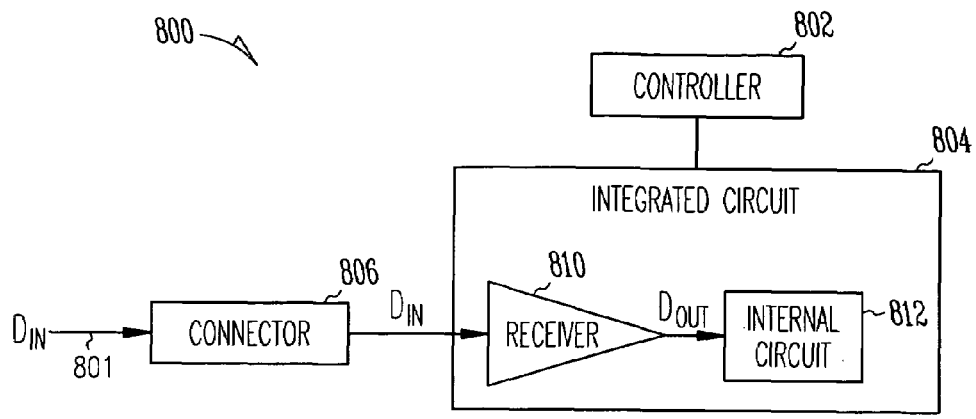
FIG. 8 shows a system according to an embodiment of the invention.

FIG. 8 shows a system according to an embodiment of the invention. System 800 includes a controller 802, an integrated circuit 804, a connector 806, and a transmission medium 801. Controller 802 may include a general purpose processor such as a microprocessor for a computer. Controller may also include an application specific integrated circuit.

Integrated circuit 804 includes a receiver 810 to receive an input data signal the $D_{IN}$ signal from transmission medium 801 via connector 806. Receiver 810 may provide the $D_{IN}$ signal received from transmission medium 801 to an internal circuit 812 as the $D_{OUT}$ signal for further processing. The $D_{OUT}$ signal is a retimed version of the $D_{IN}$ signal. Receiver 810 includes an apparatus, such as apparatus 100 and apparatus 500 described in FIG. 1 through FIG. 7, to reduce any distortion suffered by the $D_{IN}$ signal during transmission on transmission line 801.

In some embodiments, connector 806 is a serial connector to allow data such as data represented by the $D_{IN}$ signal to be transferred serially from transmission medium 801 to receiver 810. In other embodiments, connector 806 is a parallel connector, instead of a serial connector, to allow data such as data represented by the $D_{IN}$ signal to be transferred in parallel from transmission medium 801 to receiver 810.

In some embodiments, transmission medium 801 is a fiber optic cable. In other embodiments, transmission medium 801 is a metal wire such as a copper wire. In some other embodiments, transmission medium 801 is a wireless transmission medium.

In some embodiments, the $D_{IN}$ signal is transferred to receiver 810 using transfer protocols according to SONET/SDH (Synchronous Optical Network and Synchronous Digital Hierarchy). In other embodiments, the $D_{IN}$ signal is transferred to receiver 810 using transfer protocols according to TCP/IP (Transmission Control Protocol/Internet Protocol).

The illustration of system 800 in FIG. 8 is intended to provide a general understanding of the structure of various embodiments described herein. System 800 is not intended to serve as a complete description of all the elements and features of systems that might make use of the structures described herein.

System 800 of FIG. 8 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 9:
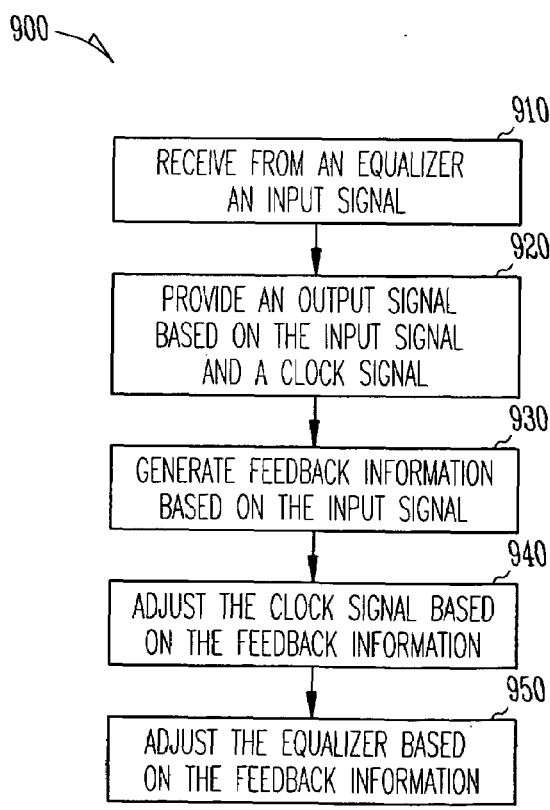
FIG. 9 is a flowchart showing a method according to an embodiment of the invention.

FIG. 9 is a flowchart showing a method according to an embodiment of the invention. In some embodiments, method 900 of FIG. 9 may be used in apparatus 100, apparatus 500, and system 800 described in FIG. 1 through FIG. 8.

Box 910 receives from an equalizer an input signal. The input signal includes a plurality of consecutive data bits including a first data bit, a second data bit, and a third data bit. The first, second, and third data bits are consecutive data bits received from the equalizer at different times. For example, the first data bit may be received during a first time interval; the second data bit may be received during a second time interval; and the third data bit may be received during a third time interval. The first time interval occurs before the second time interval. The second time interval occurs before the third time interval. Thus, if the third time interval is the current time interval, the third data bit is the current data; the second data bit is the old or previous data bit; and the first data bit is the oldest or the data bit before the previous data bit.

In some embodiments, first, second, and third time intervals correspond to consecutive cycles (periods) of a clock signal. In these embodiments, the first, second, and third data bits may be received at consecutive positive edges or consecutive negative edges of the clock signal.

Box 920 provides an output signal based on the input signal and a timing of a clock signal. The output signal is a retimed version of the input signal.

Box 930 generates a feedback information based on the input signal. In some embodiments, the feedback information is generated based on bit values of the first, second, and third data bits, and a bit value of a transition bit. The transition bit is obtained by sampling a midpoint of a transition between the second and third data bits.

In some embodiments, generating the feedback information in box 930 includes comparing the bit values of the first and second data bits, comparing the bit values of the second and third data bits, sampling a midpoint of a transition between the second and third data bits to obtain a bit value for the transition bit.

In some embodiments, an exclusive OR function may be performed to compare the bit values of the first and second data bits. An exclusive or function may be performed to compare the bit values of the second and third data bits. An exclusive or function may be performed to compare the bit value of the second data bit and the bit value of the transition bit. A binary phase detector such as phase detector 120 of FIG. 2 may be used to sample the midpoint of the transition point between the second and third data bits.

Box 940 adjusts the clock signal based on the feedback information generated from the activities in box 930. In some embodiments, the clock signal is adjusted when the bits value of the second and third data bits are different. Adjusting the clock signal in box 940 may include adjusting the clock signal in a first direction when the bits value of the second and third data bits are different and when the transition bit has a first value. Adjusting the clock signal in box 940 may also include adjusting the clock signal in a second direction when the bits value of the second and third data bits are different and when the transition bit has a second value. In some embodiments, the first direction corresponds to speeding up the clock signal; the second direction corresponds to slowing down the clock signal. In some embodiments, speeding up the clock signal includes shifting an edge of the clock signal in a first direction; slowing down the clock signal includes shifting an edge of the clock signal in a second direction. In some embodiments, adjusting the clock signal in box 940 includes modifying the frequency of the clock signal. For example, the frequency of the clock signal may be increased or decreased when the clock signal is adjusted.

Box 950 adjusts the equalizer based on the feedback information generated from the activities in box 930. In some embodiments, the equalizer is adjusted when the bits value of the first and second data bits are equal or the same and when the bits value of the second and third data bits are different. Adjusting the equalizer in box 950 may include adjusting the equalizer in a first direction when the bits value of the first and second data bits are equal, when the bits value of the second and third data bits are different, and when the transition bit has a first value. Adjusting the equalizer in box 950 may also include adjusting the equalizer in a second direction when the bits value of the first and second data bits are equal, when the bits value of the second and third data bits are different, and when the transition bit has a second value. In some embodiments, the first direction corresponds to turning up the equalizer; the second direction corresponds to turning down the equalizer. In some embodiments, turning up the equalizer includes shifting an edge of the input signal in a first direction; turning down the equalizer includes shifting an edge of the input signal in a second direction. In some embodiments, adjusting the equalizer clock signal in box 950 includes modifying the gain of the equalizer. For example, the gain of the equalizer may be increased or decreased when the clock signal is adjusted.

In method 900, the information from the same phase detector used in box 930 may be used to generate the feedback information to adjust both the clock signal and the equalizer.

The individual activities shown in FIG. 9 do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

Distortion such as pattern jitter in a retimed signal such as the $D_{OUT}$ signal may be improved by implementing the apparatus, systems, and methods described in FIG. 1 through FIG. 9.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar devices throughout the several views. Examples merely typify possible variations. Portions and features of some embodiments may be included in or substituted for those of others. Many other embodiments will be apparent to those of skill in the art upon reading and understanding the above description. Therefore, the scope of various embodiments is determined by the appended claims, along with the full range of equivalents to which such claims are entitled.

What is claimed is:

1. An apparatus comprising:
an equalizer;
a phase detector including an input to receive from the equalizer an input signal with a plurality of consecutive data bits including a first data bit, a second data bit, and a third data bit, a clock input to receive a clock signal, a data output to provide an output signal based on the input signal and the clock signal, and a feedback output to provide a feedback information based on the input signal; and
an equalization feedback loop to adjust the equalizer based on the feedback information to influence the output signal, wherein the equalization feedback loop includes an equalization adjustment circuit configured to adjust the equalizer in a first direction or a second direction based on a bit value of each of the first, second, and third data bits, and based on a bit value of a transition bit, and wherein the equalization adjustment circuit includes a decision controller configured to adjust the equalizer in the first direction to reduce jitter in the output signal when the bit value of the first data bit and the bit value of the second data bit are equal, when the bit value of the second data bit and the bit value of the third data bit are different, and when the bit value of the transition bit is equal to a first value.

2. The apparatus of claim 1, wherein the decision controller is configured to adjust the equalizer in the second direction when the bit value of the first data bit and the bit value of the second data bit are equal, when the bit value of the second data bit and the bit value of the third data bit are different, and when the bit value of the transition bit is equal to a second value.

3. The apparatus of claim 2, wherein the equalization adjustment circuit further includes an equalizer loop filter coupled between the decision controller and the equalizer.

4. An apparatus comprising:
an equalizer;
a phase detector including an input to receive from the equalizer an input signal with a plurality of consecutive data bits including a first data bit, a second data bit, and a third data bit, a clock input to receive a clock signal, a data output to provide an output signal based on the input signal and the clock signal, and a feedback output to provide a feedback information based on the input signal;

an equalization feedback loop to adjust the equalizer based on the feedback information to influence the output signal, wherein the equalization feedback loop includes an equalization adjustment circuit configured to adjust the equalizer in a first direction or a second direction based on a bit value of each of the first, second, and third data bits, and based on a bit value of a transition bit; and a clock feedback loop to adjust the clock signal based on the feedback information, wherein the clock feedback loop includes a clock adjustment circuit configured to adjust the clock signal in a first direction or a second direction based on the bit value of each of the second and third data bits, and based on the bit value of the transition bit.

5. The apparatus of claim 4, wherein the equalization adjustment circuit includes a logic gate to compare the bit value of the second data bit with the bit value of the third data bit.

6. The apparatus of claim 4, wherein the clock adjustment circuit includes a clock generator configured to adjust the clock signal in the first direction when the bit value of the second data bit and the bit value of the third data bit are different, and when the bit value of the transition bit is equal to a first value.

7. The apparatus of claim 6, wherein the clock generator is configured to adjust the clock signal in the second direction when the bit value of the second data bit and the bit value of the third data bit are different, and when the bit value of the transition bit is equal to a second value.

8. The apparatus of claim 7, wherein the clock adjustment circuit further includes a loop filter coupled between the phase detector and the clock generator.

9. The apparatus of claim 4, wherein the phase detector includes:
a number of exclusive OR (XOR) gates; and
a number of AND gates coupled to an output of each of the XOR gates.

10. A method comprising:
receiving from an equalizer an input signal having consecutive data bits including a first data bit, a second data bit, and a third data bit;
providing an output signal based on the input signal and a clock signal;
generating a feedback information based on the input signal, wherein generating the feedback information includes performing an exclusive OR (XOR) function on the first and second data bits, performing an exclusive OR (XOR) function on the second and third data bits, and performing an exclusive OR (XOR) function on the second data bit and a transition bit between the second and third data bits; and
adjusting the equalizer based on the feedback information to influence the output signal.

11. The method of claim 10 wherein adjusting the equalizer includes modifying a gain of the equalizer based on a combination of a bit value of each of the first, second, and third data bits, and a bit value of the transition bit.

12. The method of claim 11, wherein modifying a gain of the equalizer occurs when the bit value of the first data bit and the bit value of the second data bit are equal, and when the bit value of the second data bit and the bit value of the third data bit are different.

13. The method of claim 11, wherein generating the feedback information includes comparing the bit value of the second data bit with the bit value of the third data bit.

14. The method of claim 13, wherein generating the feedback information includes sampling a transition between the second and third data bits to obtain the bit value of the transition bit.

15. The method of claim 10, further comprising:
determining a direction to adjust the clock signal based on a combination of a first result and a second result, wherein the first result is obtained from performing the exclusive OR function on the second and third data bits, and wherein the second result is obtained from performing the exclusive OR function on the second data bit and the transition bit.

16. A method comprising:
receiving from an equalizer an input signal having consecutive data bits including a first data bit, a second data bit, and a third data bit;
providing an output signal based on the input signal and a clock signal;
generating a feedback information based on the input signal;
adjusting the equalizer based on the feedback information to influence the output signal, wherein adjusting the equalizer includes modifying a gain of the equalizer based on a combination of a bit value of each of the first, second, and third data bits, and a bit value of a transition bit between the second and third data bits; and
adjusting the clock signal based on the feedback information, wherein adjusting the clock signal includes modifying a frequency of the clock signal based on the bit value of each of the second and third data bits, and based on the bit value of the transition bit.

17. The method of claim 16, wherein adjusting the clock signal occurs when the bit value of the second data bit and the bit value of the third data bit are different.

18. A method comprising:
receiving from an equalizer an input signal having consecutive data bits including a first data bit, a second data bit, and a third data bit;
providing an output signal based on the input signal and a clock signal;
generating a feedback information based on the input signal;
adjusting the equalizer based on the feedback information to influence the output signal, wherein adjusting the equalizer includes modifying a gain of the equalizer based on a combination of a bit value of each of the first, second, and third data bits, and a bit value of a transition bit between the second and third data bits; and
adjusting the clock signal based on the feedback information, wherein adjusting the clock signal includes performing an exclusive OR (XOR) function on the second and third data bits to obtain a first result performing an exclusive OR (XOR) function on the second data bit and the transition bit to obtain a second result, and determining a direction to adjust the clock signal based on a combination of the first result and the second result.

19. A system comprising:
a serial connector to receive an input signal from a fiber optic cable; and
an integrated circuit including a receiver, the receiver including:
an equalizer to receive the input signal from the serial connector;

a phase detector including an input to receive the input signal from the equalizer, a clock input to receive a clock signal, a data output to provide an output signal based on the input signal and the clock signal, and a feedback output to provide a feedback information based on the input signal;

an equalization feedback to adjust the equalizer based on the feedback information to influence the output signal, the equalization feedback loop including an equalization adjustment circuit configured to adjust the equalizer in one of a first direction or a second direction based on a combination of a bit value of a first data bit of the input signal, a bit value of a second data bit of the input signal, a bit value of a third data bit of the input signal, a bit value of a transition bit, wherein the equalization adjustment circuit includes a decision controller configured to adjust the equalizer in one of the first and second directions when the bit value of the first data bit and the bit value of the second data bit are equal, when the bit value of the second data bit and the bit value of the third data bit are different; and a clock feedback loop coupled between the clock input and the feedback output to adjust the clock signal based on the feedback information, wherein the clock feedback loop includes a clock adjustment circuit configured to adjust the clock signal in a first direction or a second direction based on the bit value of each of the second and third data bits, and based on the bit value of the transition bit.

20. The system of claim 19, wherein the phase detector includes:

a number of exclusive OR (XOR) gates; and a number of AND gates coupled to an output of each of the XOR gates.

21. The system of claim 20, wherein the decision controller includes:

an exclusive OR (XOR) gate; and a number of AND gates coupled to an output of the XOR gate of the decision controller and coupled to an output of one of the XOR gates of the phase detector.

* * * * *